US010958155B2

(12) United States Patent
Ikeda

(10) Patent No.: US 10,958,155 B2
(45) Date of Patent: Mar. 23, 2021

(54) SEMICONDUCTOR DEVICE, POWER CONVERSION DEVICE, DRIVING DEVICE, VEHICLE, AND ELEVATOR

(71) Applicant: Kabushiki Kaisha Toshiba, Minato-ku (JP)

(72) Inventor: Kentaro Ikeda, Kawasaki (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 398 days.

(21) Appl. No.: 16/111,446

(22) Filed: Aug. 24, 2018

(65) Prior Publication Data

US 2019/0296634 A1    Sep. 26, 2019

(30) Foreign Application Priority Data

Mar. 22, 2018 (JP) ............................. JP2018-055173

(51) Int. Cl.
*H02M 1/32* (2007.01)
*H02M 7/5387* (2007.01)
(Continued)

(52) U.S. Cl.
CPC ............. *H02M 1/32* (2013.01); *B66B 11/043* (2013.01); *H02H 9/04* (2013.01); *H02M 7/5387* (2013.01);
(Continued)

(58) Field of Classification Search
CPC .. H02M 1/32; H02M 7/5387; H02M 7/53875; H02M 1/34; H02M 2001/342;
(Continued)

(56) References Cited

U.S. PATENT DOCUMENTS

2018/0375423 A1   12/2018  Ikeda
2019/0140536 A1*   5/2019  Ikeda ...................... H02M 1/32

FOREIGN PATENT DOCUMENTS

JP         05-344369         12/1993
JP         8-107700 A         4/1996
(Continued)

OTHER PUBLICATIONS

U.S. Appl. No. 15/896,563, filed Feb. 14, 2018, Kentaro Ikeda.
U.S. Appl. No. 15/889,414, filed Feb. 6, 2018, Kentaro Ikeda.

*Primary Examiner* — Dharti H Patel
(74) *Attorney, Agent, or Firm* — Oblon, McClelland, Maier & Neustadt, L.L.P.

(57) ABSTRACT

A semiconductor device according to an embodiment is a semiconductor device including: a first diode having a first anode and a first cathode, the first anode for electrically connecting to one of a first electrode and a second electrode of a semiconductor element including the first electrode, the second electrode, and a gate electrode; a first capacitor having a first end electrically connected to the first cathode, and a first other end; a bias element having a first bias element end electrically connected to the first cathode and the first end, and a second bias element end for electrically connecting to a positive electrode of a direct-current power supply including the positive electrode and a negative electrode; a second diode having a second anode and a second cathode, the second anode electrically connected to the first other end; a second capacitor having a second end and a second other end, the second end electrically connected to the second cathode; a switch electrically connected in parallel to the second capacitor between the second end and the second other end; an analog-digital converter or sample-and-hold circuit electrically connected to the second cathode and the second end; and a third diode having a third anode and a third cathode, the third anode electrically connected to (Continued)

the second other end, and the third cathode electrically connected to the first other end and the second anode.

20 Claims, 16 Drawing Sheets

(51) Int. Cl.
    *H02P 27/06*     (2006.01)
    *B66B 11/04*     (2006.01)
    *H02H 9/04*     (2006.01)
    *B61C 3/00*     (2006.01)
    *B60R 16/023*     (2006.01)

(52) U.S. Cl.
    CPC ............ *H02P 27/06* (2013.01); *B60R 16/023* (2013.01); *B61C 3/00* (2013.01)

(58) Field of Classification Search
    CPC ...... H02M 7/003; H02P 27/06; B66B 11/043; H02H 9/04; B61C 3/00; B60R 16/023; H03K 17/081; H03K 17/162; H03K 17/08148; H03K 17/168; G01R 19/2509
    USPC ...................................... 361/91.1
    See application file for complete search history.

(56) References Cited

FOREIGN PATENT DOCUMENTS

| | | |
|---|---|---|
| JP | 2005-176416 | 6/2005 |
| JP | 2006-42413 A | 2/2006 |
| JP | 2006-211878 | 8/2006 |
| JP | 2006-211880 | 8/2006 |
| JP | 4336573 | 9/2009 |
| JP | 4577030 | 11/2010 |
| JP | 2013-27217 A | 2/2013 |
| JP | 2019-9914 | 1/2019 |
| JP | 2019-88095 A | 6/2019 |

* cited by examiner

SEMICONDUCTOR DEVICE, POWER CONVERSION DEVICE, DRIVING DEVICE, VEHICLE, AND ELEVATOR

CROSS-REFERENCE TO RELATED APPLICATION

This application is based upon and claims the benefit of priority from Japanese Patent Application No. 2018-055173, filed on Mar. 22, 2018, the entire contents of which are incorporated herein by reference.

FIELD

Embodiments described herein relate generally to a semiconductor device, a power conversion device, a driving device, a vehicle, and an elevator.

BACKGROUND

In a power transistor that performs switching operation at high speed, a surge voltage due to parasitic inductance may be generated, for example, when the transistor is turned off. The generation of the surge voltage is problematic, because a gate insulating film is destroyed, or ringing is caused in the circuit. The surge voltage is a high voltage and generated in a short period of time, and thus difficult to detect.

DETAILED DESCRIPTION

Figure 1:
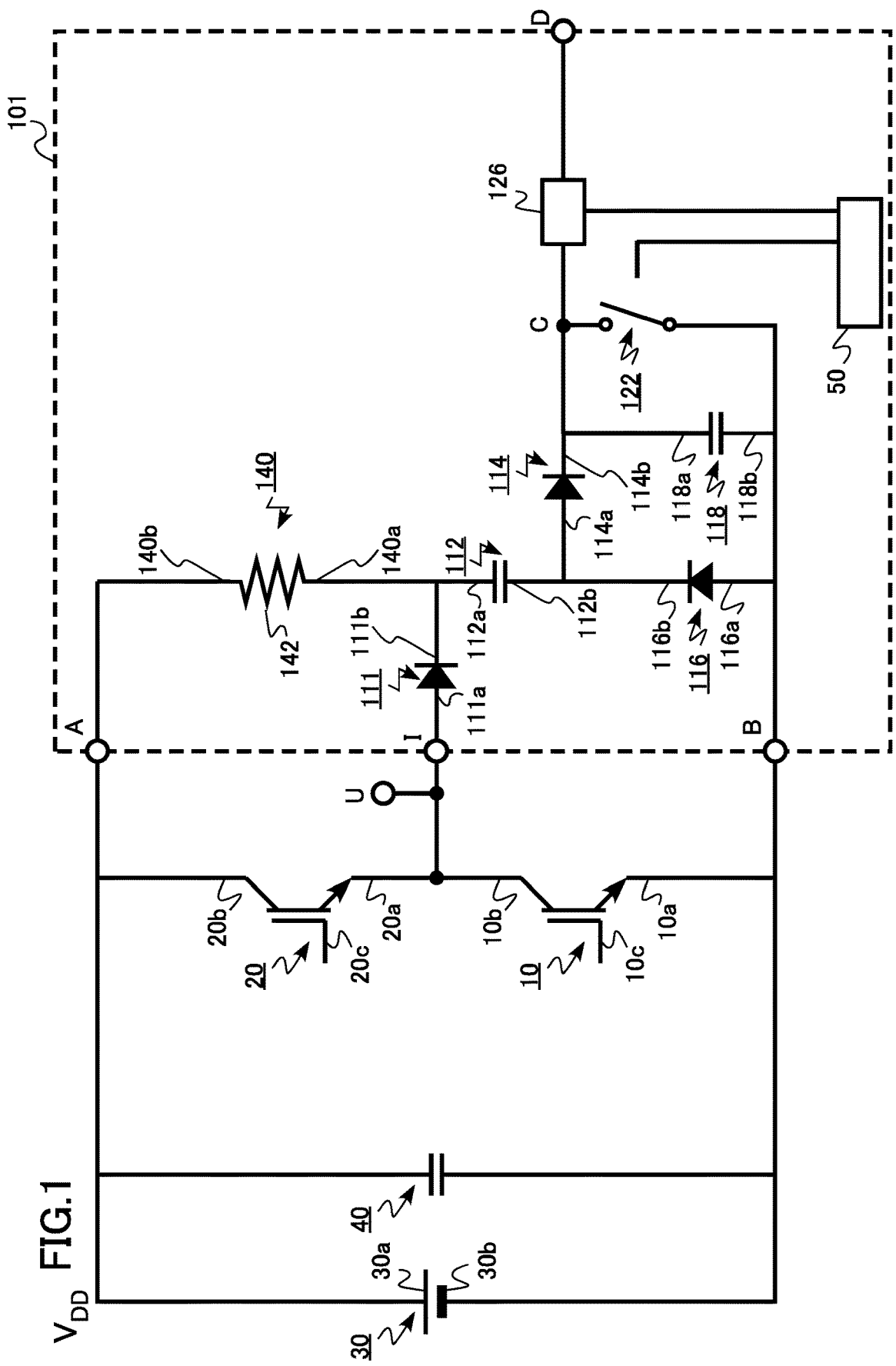
FIG. 1 is a schematic diagram of a semiconductor device according to the first embodiment.

A semiconductor device according to an embodiment is a semiconductor device including: a first diode having a first anode and a first cathode, the first anode for electrically connecting to one of a first electrode and a second electrode of a semiconductor element including the first electrode, the second electrode, and a gate electrode; a first capacitor having a first end electrically connected to the first cathode, and a first other end; a bias element having a first bias element end electrically connected to the first cathode and the first end, and a second bias element end for electrically connecting to a positive electrode of a direct-current power supply including the positive electrode and a negative electrode; a second diode having a second anode and a second cathode, the second anode electrically connected to the first other end; a second capacitor having a second end and a second other end, the second end electrically connected to the second cathode; a switch electrically connected in parallel to the second capacitor between the second end and the second other end; an analog-digital converter or sample-and-hold circuit electrically connected to the second cathode and the second end; and a third diode having a third anode and a third cathode, the third anode electrically connected to the second other end, and the third cathode electrically connected to the first other end and the second anode.

Hereinafter, embodiments of the present disclosure will be described with reference to the drawings. It is to be noted that in the following description, the same or similar members or the like are denoted by the same reference numerals, and the description of the members or the like once described will be omitted as appropriate.

In addition, in this specification, a semiconductor device has a concept that encompasses power modules with a plurality of elements combined, such as an integrated circuit (IC) with a plurality of elements integrated into a single chip, an electronic circuit board with electronic components disposed, or a discrete semiconductor.

First Embodiment

The semiconductor device according to the present embodiment is a semiconductor device including: a first diode having a first anode and a first cathode, the first anode for electrically connecting to one of a first electrode and a second electrode of a semiconductor element including the first electrode, the second electrode, and a gate electrode; a first capacitor having a first end electrically connected to the first cathode, and a first other end; a bias element having a first bias element end electrically connected to the first cathode and the first end, and a second bias element end for electrically connecting to a positive electrode of a direct-current power supply including the positive electrode and a negative electrode; a second diode having a second anode and a second cathode, the second anode electrically connected to the first other end; a second capacitor having a second end and a second other end, the second end electrically connected to the second cathode; a switch electrically connected in parallel to the second capacitor between the second end and the second other end; an analog-digital converter or sample-and-hold circuit electrically connected to the second cathode and the second end; and a third diode having a third anode and a third cathode, the third anode electrically connected to the second other end, and the third cathode electrically connected to the first other end and the second anode.

In addition, a power conversion device according to the present embodiment includes the above-described semiconductor device.

FIG. 1 is a schematic diagram of the semiconductor device according to the present embodiment. The semiconductor device according to the present embodiment serves as a surge voltage detection circuit 101.

Figure 2:
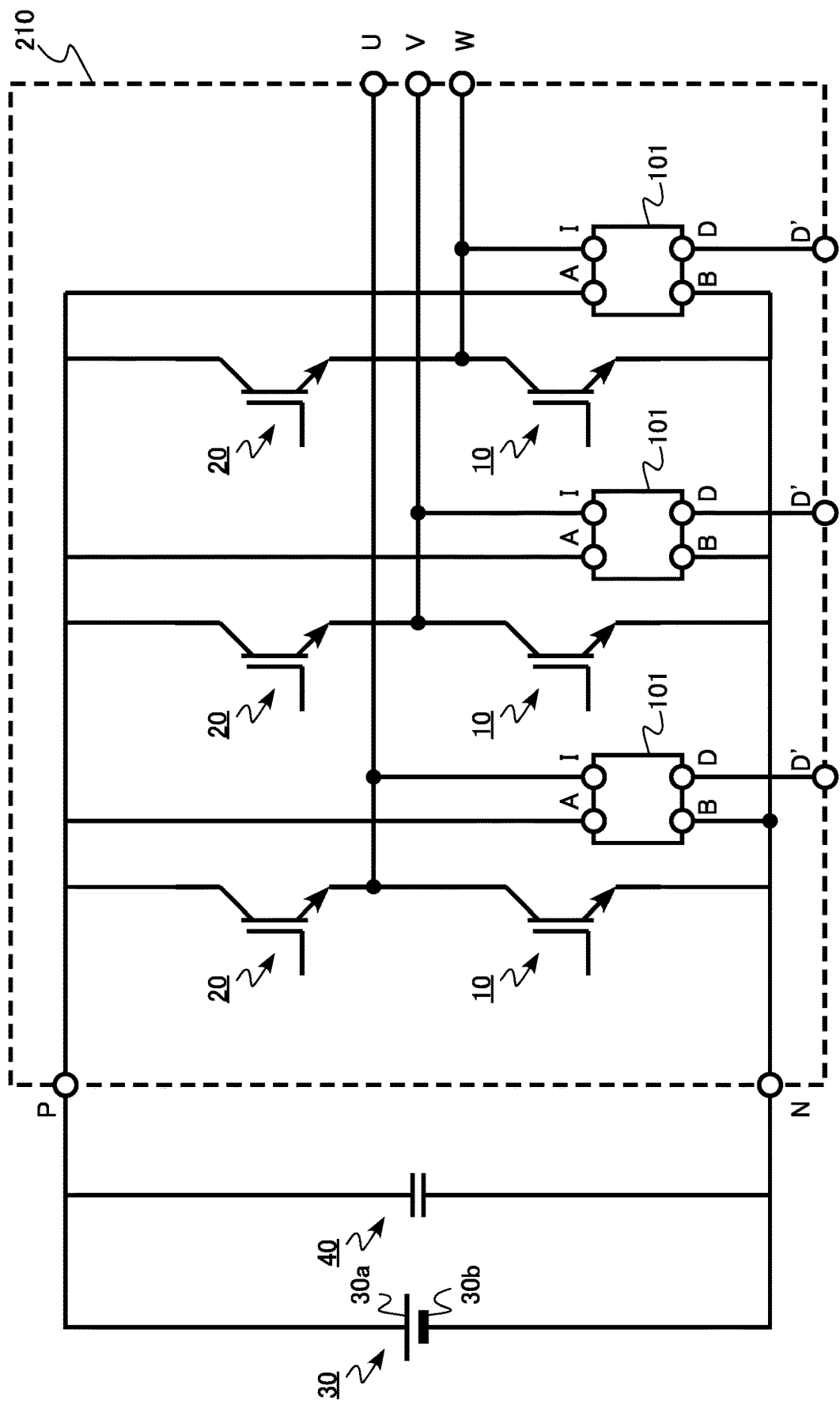
FIG. 2 is a schematic diagram of a power conversion device according to the first embodiment.

FIG. 2 is a schematic diagram of the power conversion device according to the present embodiment. The power conversion device according to the present embodiment serves as an inverter circuit 210 including the surge voltage detection circuit 101.

FIG. 1 is a diagram illustrating a part of the inverter circuit 210. FIG. 1 is a diagram illustrating the detailed configuration of the surge voltage detection circuit 101.

The inverter circuit 210 shown in FIG. 2 includes three pairs of low-side transistors 10 and high-side transistors 20, three surge voltage detection circuits 101, a positive terminal P, a negative terminal N, an output terminal U, an output terminal V, an output terminal W, and a detection terminal D'. The positive terminal P is connected to a positive electrode 30a of a direct-current power supply 30, and the negative terminal N is connected to a negative electrode 30b of the direct-current power supply 30. For example, a smoothing capacitor 40 is provided in parallel with the direct-current power supply 30 between the positive terminal P and the negative terminal N. The inverter circuit 210 serves as a three-phase inverter. The result of the surge voltage detected by the surge voltage detection circuit 101 is output from the detection terminal D'.

The voltage of the direct-current power supply 30 is, for example, 200 V or higher and 1500 V or lower. The direct-current power supply 30 supplies the power supply voltage $V_{DD}$ of the transistors (the low-side transistors 10 and the high-side transistors 20).

The low-side transistors 10 and the high-side transistors 20 are not particularly restricted by type, as long as the low-side and high-side transistors serve as transistors. The semiconductor device and the power conversion device according to the present embodiment can be applied to transistors in general regardless of what transistor the low-side transistors 10 and the high-side transistors 20 serve as. The low-side transistors 10 and the high-side transistors 20 may be, for example, an insulated gate bipolar transistor (IGBT), a metal oxide semiconductor field effect transistor (MOSFET), a bipolar junction transistor (BJT), or the like. It is to be noted that the low-side transistors 10 and the high-side transistors 20 are examples of semiconductor elements. The low-side transistors 10 and the high-side transistors 20 contain SiC (silicon carbide), a nitride semiconductor material such as GaN (gallium nitride), AlGaN, and InGaN, Si (silicon), GaO (gallium oxide), or diamond semiconductor, and serve as a transistor manufactured with the use of SiC, a nitride semiconductor material, Si, GaO, or a diamond semiconductor. In addition, the low-side transistors 10 and the high-side transistors 20 may have, for example, a freewheeling diode or the like, not shown, and other cascode-connected elements.

The surge voltage detection circuits 101 may be, for example, an IC with a plurality of elements integrated as one chip, or an electronic circuit board with a plurality of electronic components disposed. The surge voltage detection circuit 101 detects a surge voltage generated between the low-side transistor 10 and the high-side transistor 20. A semiconductor module 151 includes the surge voltage detection circuits 101, the low-side transistors 10, and the high-side transistors 20.

FIG. 1 shows one pair of low-side transistor 10 and high-side transistor 20 connected to the output terminal U, among the three pairs of low-side transistors 10 and high-side transistors 20 of the inverter circuit 210. Also shown is the surge voltage detection circuit 101 connected to the one pair of low-side transistor 10 and high-side transistor 20.

The surge voltage detection circuit 101 includes a first diode 111, a first capacitor 112, a second diode 114, a third diode 116, a second capacitor 118, a switch 122, an analog-digital converter 126, a bias element 140, a controller 50, an input terminal A, an input terminal B, an input terminal I, and a detection terminal D.

The low-side transistor 10 of the inverter circuit 210 has an emitter electrode 10a (first electrode), a collector electrode 10b (second electrode), and a gate electrode 10c. The high-side transistor 20 of the inverter circuit 210 has an emitter electrode 20a (first electrode), a collector electrode 20b (second electrode), and a gate electrode 20c.

The input terminal A of the surge voltage detection circuit 101 is to electrically connect to the positive electrode 30a of the direct-current power supply 30. The input terminal B of the surge voltage detection circuit 101 is to electrically connect to the negative electrode 30b of the direct-current power supply 30.

The input terminal I of the surge voltage detection circuit 101 is to electrically connect to the collector electrode 10b of the low-side transistor 10 and the emitter electrode 20a of the high-side transistor 20. The input terminal I is to electrically connect to a site where a surge voltage can be generated in an electronic circuit.

The result of detecting the surge voltage is output from the detection terminal D of the surge voltage detection circuit 101.

The first diode 111 has a first anode 111a and a first cathode 111b. The first anode 111a is to electrically connect via the input terminal I to any one of the collector electrode 10b of the low-side transistor 10 and the emitter electrode 20a of the high-side transistor 20. It is to be noted that in FIG. 1, the first anode 111a is electrically connected via the input terminal I to both the collector electrode 10b of the low-side transistor 10 and the emitter electrode 20a of the high-side transistor 20. The first anode 111a is electrically connected via the input terminal I to a site where a surge voltage can be generated in the electronic circuit.

The first capacitor 112 has a first end 112a and a first other end 112b. The first end 112a is electrically connected to the first cathode 111b.

The bias element 140 has a first bias element end 140a and a second bias element end 140b. The first bias element end 140a is electrically connected to the first cathode 111b and the first end 112a. The second bias element end 140b is to electrically connect to the positive electrode 30a of the direct-current power supply 30. It is to be noted that in FIG. 1, the second bias element end 140b is electrically connected via the input terminal A to the positive electrode 30a of the direct-current power supply 30.

The bias element 140 is to change freely the voltage between the first cathode 111b and the first end 112a so that the surge voltage can be detected without being fixed at the power supply voltage $V_{DD}$ for the transistors. In other words, if the bias element 140 is not provided, the voltage between the first cathode 111b and the first end 112a is fixed at the power supply voltage $V_{DD}$ for the transistors via the input terminal A, thereby making it impossible to detect the surge voltage. Therefore, the bias element 140 is provided.

In the semiconductor device according to the present embodiment, the bias element 140 is a resistance element 142.

The second diode 114 has a second anode 114a and a second cathode 114b. The second anode 114a is electrically connected to the first other end 112b of the first capacitor 112. The second diode 114 is preferably a Schottky barrier diode.

The second capacitor 118 has a second end 118a and a second other end 118b. The second end 118a is electrically connected to the second cathode 114b of the second diode 114.

The analog-digital converter 126 is electrically connected to the second cathode 114b and the second end 118a. The analog-digital converter 126 digitally converts the voltage between the second cathode 114b and the second end 118a. The digitally converted voltage signal can be input to a known display, and displayed as a voltage value, for example. As a result, the digitally converted voltage can be measured. It is to be noted that the signal of the digitally converted voltage can be used for controlling the operation of the switch 122 and the like, by inputting the signal to the controller 50 such as a commercially available microcomputer.

The switch 122 is connected electrically in parallel with the second capacitor 118 between the second end 118a and the second other end 118b. The switch 122 electrically connects the second end 118a and the second other end 118b to discharge the electric charge charged in the second capacitor 118. The switch 122 serves as, for example, but not limited to, a transistor.

The on/off operation of the switch 122 is controlled by the controller 50, for example. The controller 50 serves as, for example, a microcomputer. The controller 50 may be provided, for example, inside or outside the surge voltage detection circuit 101. It is to be noted that the controller 50 is an example of a first controller.

The third diode 116 has a third anode 116a and a third cathode 116b. The third cathode 116b is electrically connected to the first other end 112b of the first capacitor 112 and the second anode 114a of the second diode 114. The third diode 116 is preferably a Schottky barrier diode.

The first capacitor 112 and the second capacitor 118 are preferably film capacitors or ceramic capacitors.

The film capacitor is a capacitor that uses, for the dielectric, a resin such as polyethylene terephthalate (PET), polypropylene (PP), polyphenylene sulfide (PPS), polyethylene naphthalate (PEN), or polystyrene (PS).

The ceramic capacitor is a capacitor that uses, for the dielectric, ceramics such as titanium oxide, aluminum oxide, barium titanate, or strontium titanate.

The power supply voltage $V_{DD}$ of the transistor (semiconductor element), the capacitance $C_1$ of the first capacitor 112, and the capacitance $C_2$ of the second capacitor 118 preferably satisfy the relationship of 15 V $(C_1 V_{DD})/(C_1+C_2)$.

The capacitance $C_1$ of the first capacitor 112 is preferably 1/10 or less of the output capacitance of the low-side transistor 10 or the high-side transistor 20 (semiconductor element).

The capacitance $C_2$ of the second capacitor 118 is preferably 100 pF or more.

Figure 3A:
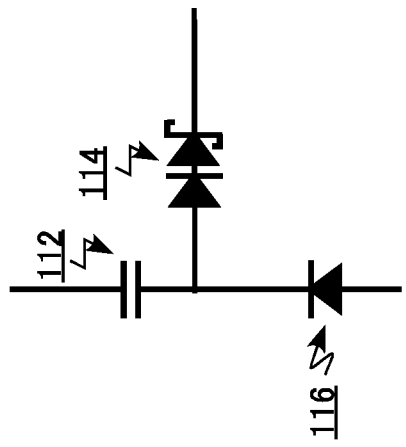
FIGS. 3A to 3C are schematic diagrams illustrating examples of a second diode according to the first embodiment.
Figure 3B:
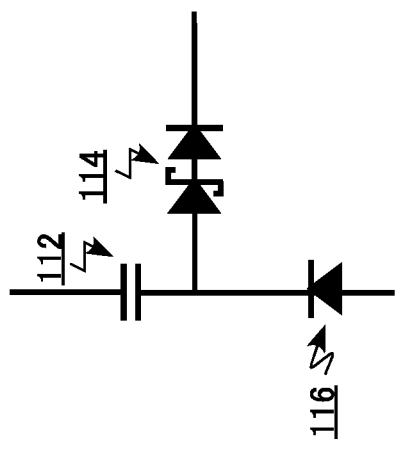
Figure 3C:
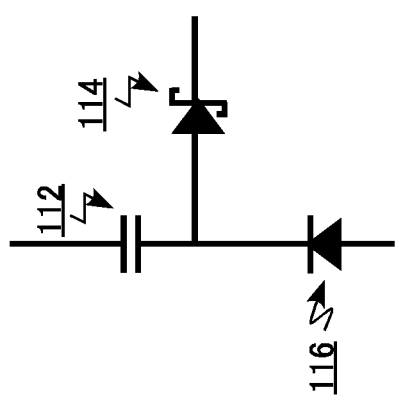

FIGS. 3A to 3C are schematic diagrams illustrating examples of the second diode 114 according to the present embodiment.

FIG. 3A is an example of a part of the surge voltage detection circuit 101 according to the present embodiment, including a Schottky barrier diode as the second diode 114. FIGS. 3B and 3C are examples of a part of the surge voltage detection circuit 101 according to the present embodiment, using a combination of a Schottky barrier diode and a PN diode as the second diode 114. It is to be noted that as shown in FIG. 3B, a Schottky barrier diode may be electrically connected between the first capacitor 112 and the PN diode. Alternatively, as shown in FIG. 3C, a PN diode may be connected between the first capacitor 112 and the Schottky barrier diode.

Figure 4:
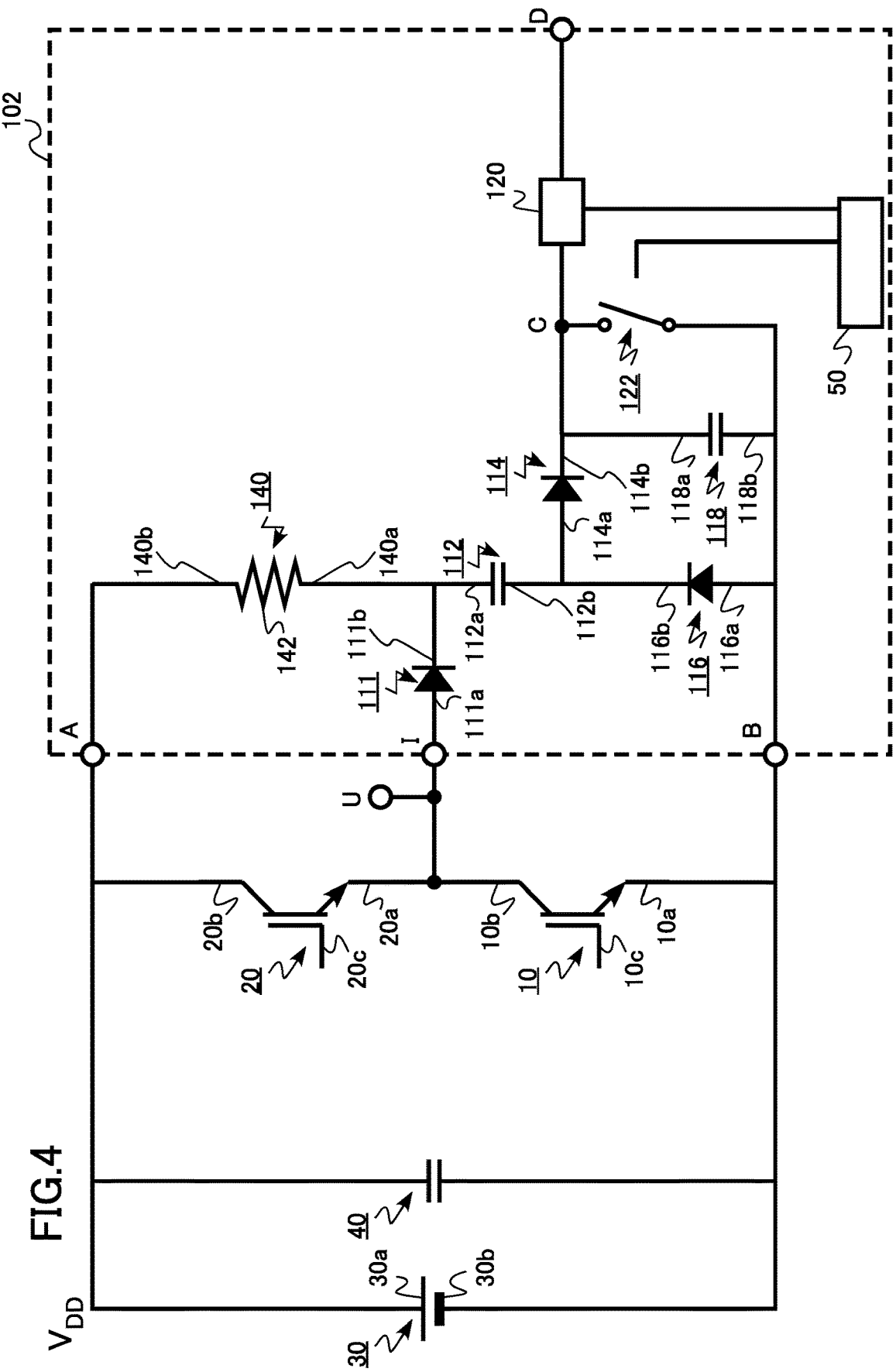
FIG. 4 is a schematic diagram of a semiconductor device according to a modified example of the first embodiment.

FIG. 4 is a schematic diagram of a surge voltage detection circuit 102, which is a modified example of the present embodiment shown in FIG. 1. A semiconductor module 152 includes the surge voltage detection circuit 102, a low-side transistor 10, and a high-side transistor 20. The analog-digital converter 126 shown in FIG. 1 may be the sample-and-hold circuit 120 shown in FIG. 4.

The sample-and-hold circuit 120 has, for example, an operational amplifier, a diode, a capacitor, and a reset switch (not shown). The sample-and-hold circuit 120 has the function of maintaining the peak value of the voltage input to the operational amplifier of the sample hold circuit 120 for a predetermined period of time. The configuration of the sample-and-hold circuit 120 is not necessarily limited to the configuration mentioned above, as long as the circuit has a function of maintaining the peak value for a predetermined period.

Figure 5:
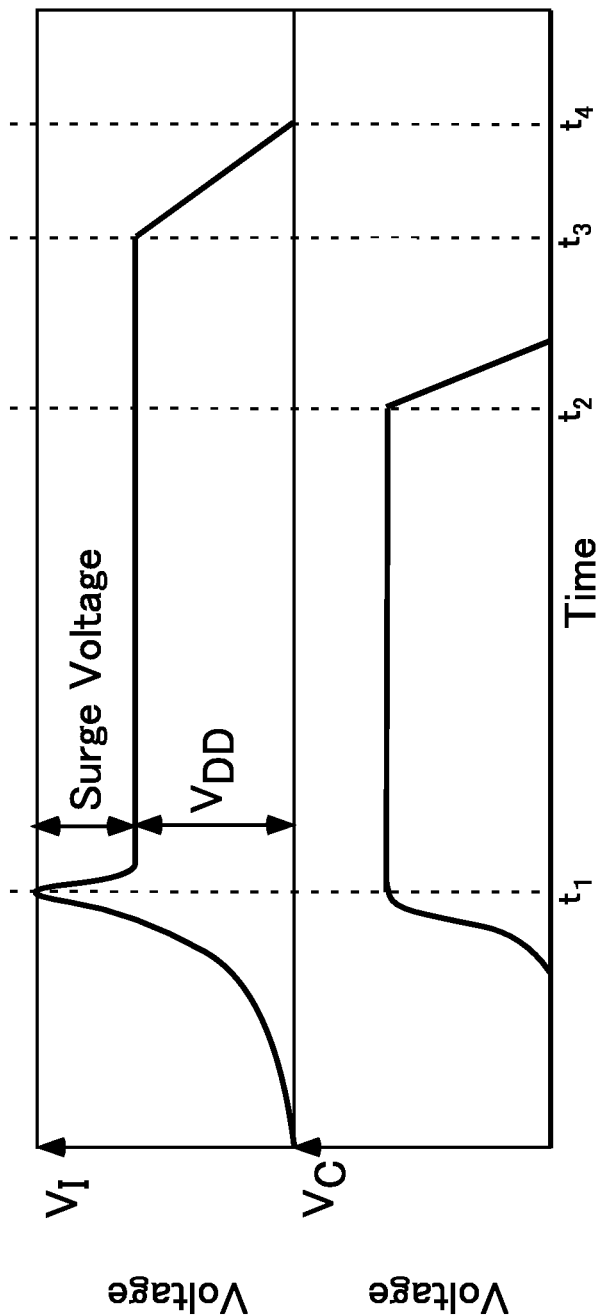
FIG. 5 is a schematic diagram showing temporal changes in voltage and current in the semiconductor device according to the first embodiment.

FIG. 5 is a schematic diagram showing temporal changes in voltage and current in the semiconductor device according to the present embodiment. FIG. 5 shows the voltage $V_I$ at the input terminal I and the voltage $V_C$ at the point C (FIG. 1) between the second cathode 114b and the analog-digital converter 126.

The operation of the semiconductor device according to the present embodiment will be described with reference to FIG. 5.

A surge is generated when the transistor of the inverter circuit 210 is turned from on to off. In this regard, a case will be considered where the low-side transistor 10 is turned from on to off, whereas the high-side transistor 20 is turned from off to on. While the low-side transistor 10 is on, the resistance of the low-side transistor 10 is zero. Therefore, the $V_I$ is zero while the low-side transistor 10 is on.

Next, it will be assumed that the low-side transistor 10 is turned from on to off, thereby generating a surge, the surge voltage reaches the maximum at time $t_1$, and the surge then disappears.

$V_I$ is increased with time. Then, at the time $t_1$, the maximum of the voltage corresponding to the generation of the surge voltage is detected at $V_I$.

The voltage of the first cathode 111b of the first diode 111 is the power supply voltage $V_{DD}$ of the direct-current power supply 30, because the first cathode 111b is electrically connected via the bias element 140 to the positive electrode 30a of the direct-current power supply 30. Therefore, the first diode 111 provides no conduction until $V_I$ becomes higher than $V_{DD}$.

When $V_I$ becomes higher than $V_{DD}$, the first diode 111 provides conduction. A displacement current flows through the first capacitor 112. Next, the second diode 114 is turned on, and electric charge is accumulated in the second capacitor 118. Therefore, the $V_C$ is increased.

In this regard, the first diode 111, the first capacitor 112, the second diode 114, and the second capacitor 118 function as circuits connected in series. The first diode 111 and the second diode 114 each generally have a low resistance component, and thus, if the component is considered negligible, function as a series circuit of the first capacitor 112 and the second capacitor 118. Therefore, the voltage obtained by dividing the surge voltage in accordance with the capacitance of the first capacitor 112 and the capacitance of the second capacitor 118 is detected as $V_C$.

The surge disappears after the time $t_1$. Therefore, $V_I$ is decreased after the time $t_1$ has elapsed. In this regard, the high-side transistor 20 is turned from off to on, whereas the low-side transistor 10 is turned from on to off, and the power supply voltage $V_{DD}$ of the transistor is thus detected as $V_I$.

Even if the voltage of $V_I$ drops to $V_{DD}$, the electric charge accumulated in the second capacitor 118 will not flow to the first capacitor 112, because the second diode 114 is provided. Therefore, the voltage of the second capacitor 118 is maintained. Then, the voltage of the second capacitor 118, that is, $V_C$, is digitally converted with the use of the analog-digital converter 126. The signal of digitally converted $V_C$ is input to the controller 50, for example, and used for controlling the timing of on/off for the switch 122. In addition, the signal of digitally converted $V_C$ may be input to a known display to display the voltage value, and used for $V_C$ measurement.

At time $t_2$, the switch 122 is used to discharge the electric charge accumulated in the second capacitor 118. As a result, $V_C$ reaches zero. As shown in FIG. 5, when the surge voltage generated around the time $t_1$ disappears with time, $V_C$ has a constant value. Then, for example, after the controller 50 is used to confirm that the $V_C$ digitally converted by the analog-digital converter 126 has become constant, the switch 122 may be used to discharge the electric charge in the second capacitor 118.

At time $t_3$, it will be assumed that the low-side transistor 10 is turned on, whereas the high-side transistor 20 is turned off. In this regard, $V_I$ decreases with time, and reaches zero at time $t_4$. Since the second diode 114 is provided, no current flows from the second capacitor 118 to the first capacitor 112, but a current flows from the third diode 116 to the first capacitor 112.

Figure 6:
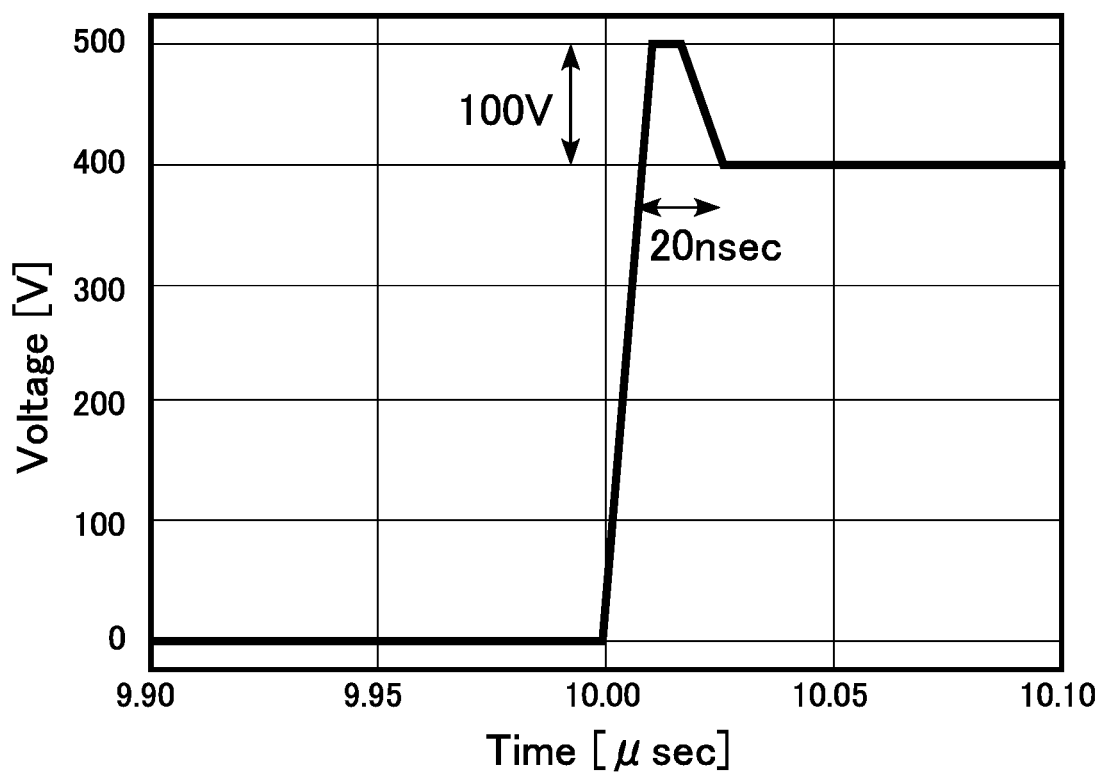
FIG. 6 is a schematic diagram showing an example of the waveform of a surge voltage.

FIG. 6 is a schematic diagram showing an example of the waveform of a surge voltage. At the time of 10 is, a surge voltage is generated which is about 20 nsec in width and 100 V in magnitude. The voltage reaches a maximum at 10.01 μs. It is to be noted that the main voltage is 400 V.

Figure 7:
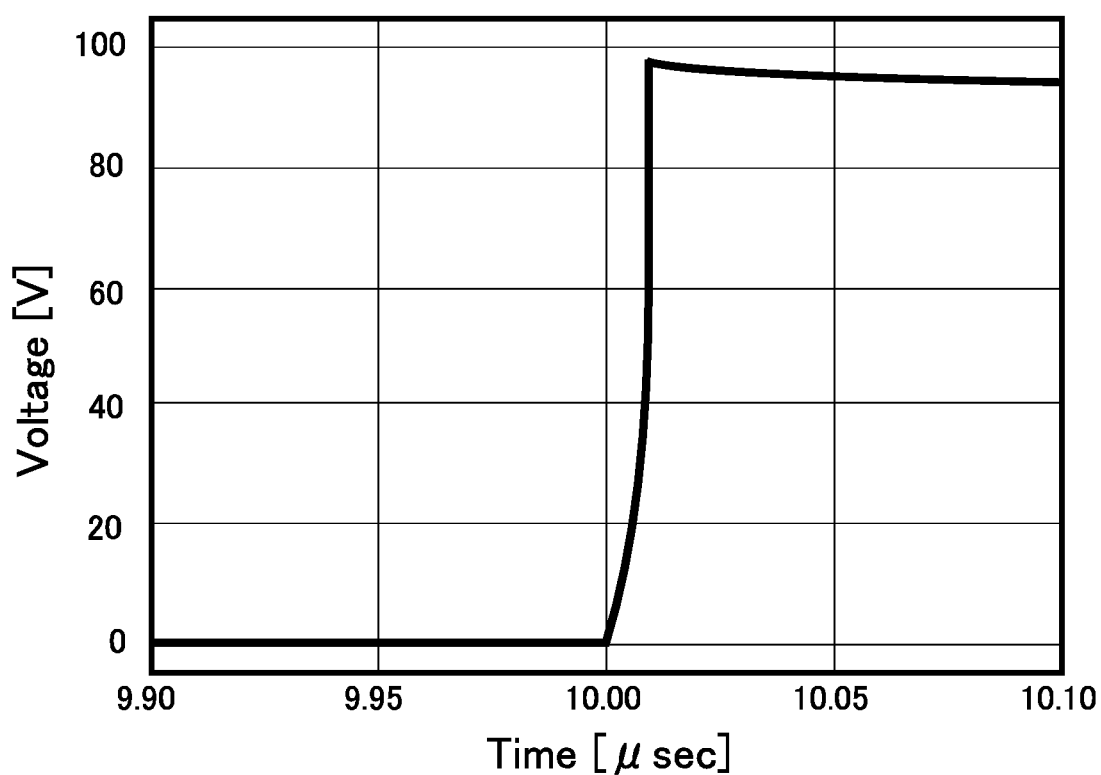
FIG. 7 is a schematic diagram showing surge voltage detection characteristics of the semiconductor device according to the first embodiment.

FIG. 7 is a schematic diagram showing surge voltage detection characteristics of the semiconductor device according to the present embodiment. For FIG. 7, the surge voltage shown in FIG. 6 is corrected with the voltage division ratio between the first capacitor 112 and the second capacitor 118, and then detected by the semiconductor device according to the present embodiment with the use of the analog-digital converter 126. At the time of 10 is, a rise of the voltage is detected. The detected voltage reaches a maximum at time 10.01 μs as in FIG. 6.

Next, the operations and effects of the semiconductor device and power conversion device according to the present embodiment will be described.

As in the present embodiment, the surge voltage detection is allowed by including: a first diode including a first anode and a first cathode, the first anode for electrically connecting to one of a first electrode and a second electrode of a semiconductor element including the first electrode, the second electrode, and a gate electrode; a first capacitor including a first end electrically connected to the first cathode, and a first other end; a bias element including a first bias element end electrically connected to the first cathode and the first end, and a second bias element end for electrically connecting to a positive electrode of a direct-current power supply including the positive electrode and a negative electrode; a second diode including a second anode and a second cathode, the second anode electrically connected to the first other end; a second capacitor including a second end and a second other end, the second end electrically connected to the second cathode; a switch electrically connected in parallel to the second capacitor between the second end and the second other end; an analog-digital converter or sample-and-hold circuit electrically connected to the second cathode and the second end; and a third diode including a third anode and a third cathode, the third anode electrically connected to the second other end, and the third cathode electrically connected to the first other end and the second anode.

In a power transistor that performs switching operation at high speed, a surge voltage due to parasitic inductance may be generated, for example, when the transistor is turned off. The generation of the surge voltage is problematic, because the gate insulating film is destroyed, or ringing is caused in the circuit.

The peak value of the surge voltage generated in the power transistor has a high voltage of several hundred volts, and the peak has a short pulse width of several tens of nanoseconds. For this reason, for example, it is difficult to detect the peak value of the surge voltage only with the existing analog-digital converter 126 and the sample-and-hold circuit 120.

In the semiconductor device and the power conversion device according to the present embodiment, a displacement current is applied to flow by the first capacitor 112, and electric charge is accumulated in the second capacitor 118. Then, the voltage increased by the charge accumulation is detected by the analog-digital converter 126 or the sample-and-hold circuit 120. Thus, the detection of the surge voltage becomes possible. It is to be noted that the discharge of the charge accumulated in the second capacitor 118 is avoided by the second diode 114.

Since the bias element 140 is provided, the voltage between the first cathode 111b and the first end 112a can be freely changed so that the surge voltage is detectable without being fixed at the power supply voltage $V_{DD}$ of the transistor.

When the surge voltage disappears, a current flows from the first capacitor 112 toward the input terminal I. This current flow is guaranteed by the third diode 116.

There is a possibility that the surge voltage may be generated every time the transistor is turned off, for example. Therefore, it is preferable that the surge voltage detection circuit 101 can measure the surge voltage frequently. In the semiconductor device and the power conversion device according to the present embodiment, the switch 122 is provided, thus making it possible to discharge the electric charge accumulated in the second capacitor 118 point by point.

In addition, in the semiconductor device according to the present embodiment, the surge voltage is divided by using the first capacitor 112 and the second capacitor 118, and thus, for the second diode 114 and the third diode 116, there is no need to use diodes which are high in withstand voltage, and diodes can be used which are low in withstand voltage.

Therefore, as the second diode 114, it is possible to use a diode which has favorable recovery characteristics. Thus, even when the surge voltage drops due to switching for the transistor, the reverse flow through the second diode 114 can be prevented. Thus, since there is temporally room for measuring the surge voltage, it is possible to measure the surge voltage by using the analog-digital converter 126 and the sample-and-hold circuit 120.

The Schottky barrier diode, which has excellent recovery characteristics, can be used as the second diode 114 in a preferred manner.

As the third diode 116, it is preferable to use a Schottky barrier diode for suppressing the reverse flow from the second capacitor 118 and thus measuring the surge voltage with high accuracy.

On the other hand, as the first diode 111, any diode can be used in a preferred manner as long as the diode satisfies the requirement for withstand voltage, even if the recovery characteristics are somewhat degraded.

The film capacitor and the ceramic capacitor have favorable frequency characteristics, thus making it possible to detect a surge voltage with a narrow half-value width through the use of the first capacitor 112 and the second capacitor 118.

The withstand voltage of the operational amplifier used for the sample-and-hold circuit 120 is most often 15 V. Therefore, if the voltage $(C_1 V_{DD})/(C_1+C_2)$ applied to the second capacitor 118 is 15V or lower, it is easy to utilize the existing sample-and-hold circuit 120.

The capacitance $C_1$ of the first capacitor 112 is preferably low enough not to affect the operation of the low-side transistor 10 or the high-side transistor 20. This is because when the capacitance $C_1$ of the first capacitor 112 is excessively increased, a large capacitance is connected to the low-side transistor 10 or the high-side transistor 20, thus affecting the operation of the power conversion device, and as a result, also affecting the measurement of the surge generated by the power conversion device. As long as the capacitance $C_1$ of the first capacitor 112 is 1/10 or less of the output capacitance of the low-side transistor 10 or the high-side transistor 20, it is possible to measure the surge without affecting the operation of the power conversion device.

If the capacitance $C_2$ of the second capacitor 118 is less than 100 pF, leakage will be increased, thus making it difficult to accumulate electric charge in a stable manner. Therefore, the capacitance $C_2$ of the second capacitor 118 is preferably 100 pF or more.

The semiconductor device and the power conversion device according to the present embodiment make it possible to provide a semiconductor device and a power conversion device which are capable of detecting a surge voltage.

Second Embodiment

The semiconductor device according to the present embodiment is different from the first embodiment in that a bias element 140 further includes a fourth diode 144 connected in parallel to a resistance element 142. In this regard, descriptions of contents that overlap with the first embodiment will be omitted.

Figure 8:
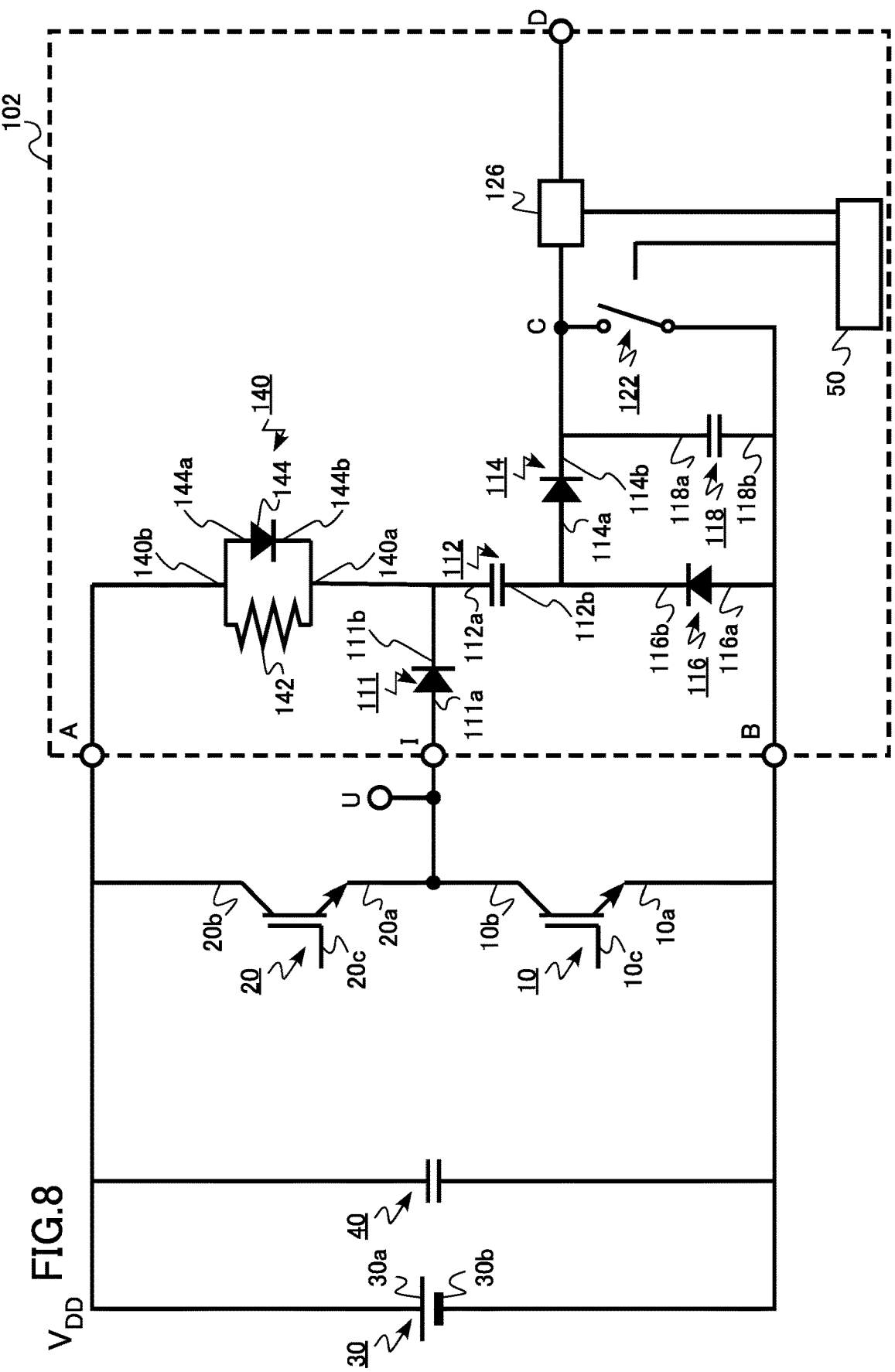
FIG. 8 is a schematic diagram of a semiconductor device according to a second embodiment.

FIG. 8 is a schematic diagram of the semiconductor device according to the present embodiment. The semiconductor device according to the present embodiment serves as a surge voltage detection circuit 103. A semiconductor module 153 includes the surge voltage detection circuit 103, a low-side transistor 10, and a high-side transistor 20.

The bias element 140 further includes the fourth diode 144 connected in parallel to the resistance element 142. The fourth diode 144 has a fourth anode 144a and a fourth cathode 144b. The fourth cathode 144b is electrically connected to a first cathode 111b and a first end 112a.

The resistance component of the resistance element 142 used for the bias element 140 is preferably larger, because the peak of a surge voltage can be maintained by earning the time constant.

However, if the resistance component of the resistance element 142 is excessively large, a voltage drop is generated through the resistance element 142, and thus, in the case where the voltage between the first cathode 111b and the first end 112a is preferably $V_{DD}$, the voltage may be lower than $V_{DD}$ in some cases.

In the surge voltage detection circuit 103 according to the present embodiment, the fourth diode 144 is provided to be connected in parallel to the resistance element 142. Therefore, in the case where the voltage between the first cathode 111b and the first end 112a is preferably $V_{DD}$, the voltage is kept at $V_{DD}$ via the fourth diode 144.

In addition, since the resistance element 142 is also provided together for the bias element 140, the peak of the surge voltage can be maintained by earning the time constant.

The semiconductor device and the power conversion device according to the present embodiment make it possible to provide a semiconductor device and a power conversion device which are capable of detecting a surge voltage.

Third Embodiment

The semiconductor device according to the present embodiment is different from the first embodiment and the second embodiment in that a bias element 140 serves as an inductance element 146. In this regard, descriptions of contents that overlap with the first and second embodiments will be omitted.

Figure 9:
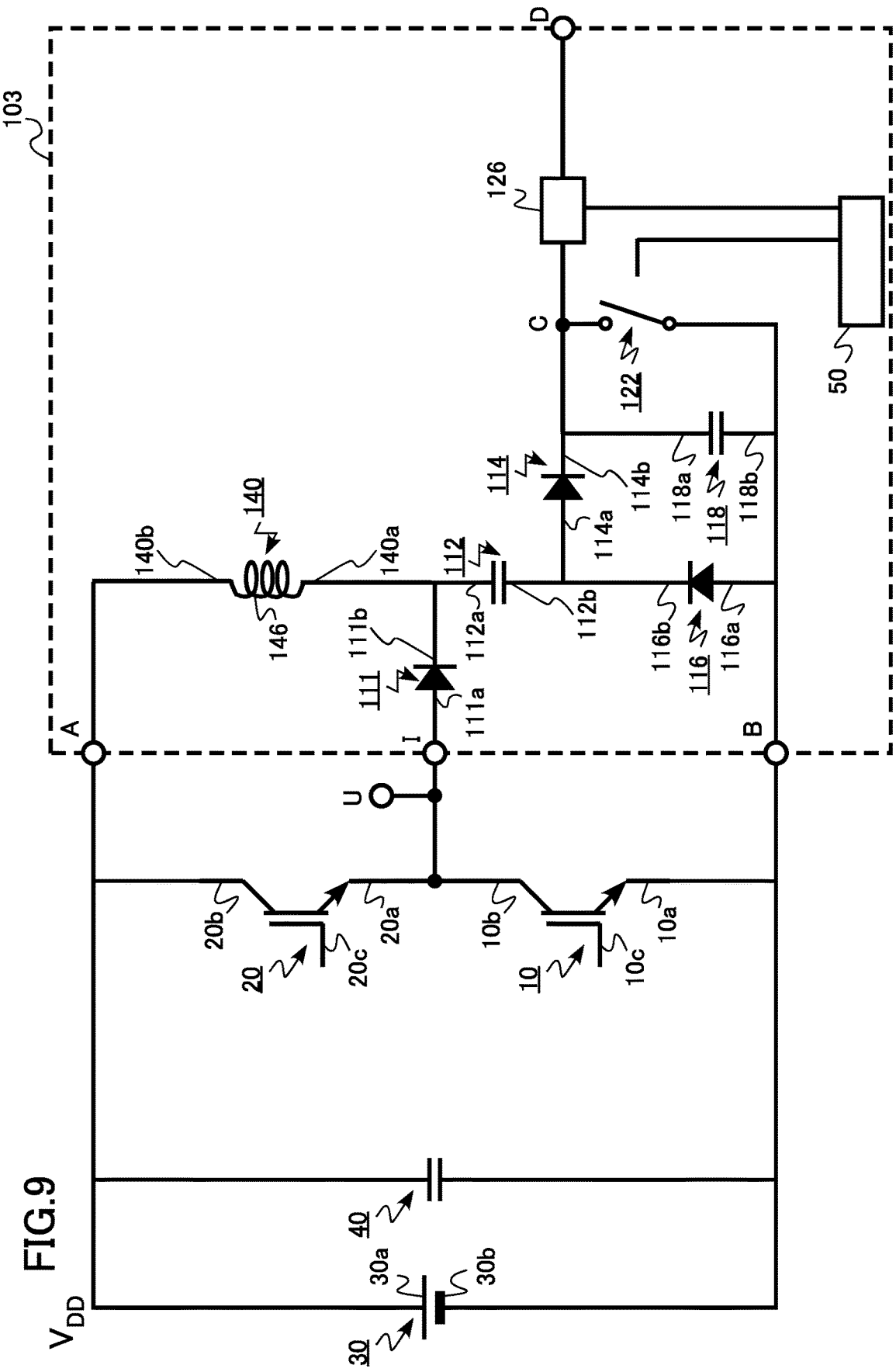
FIG. 9 is a schematic diagram of a semiconductor device according to a third embodiment.

FIG. 9 is a schematic diagram of the semiconductor device according to the present embodiment. The semiconductor device according to the present embodiment serves as a surge voltage detection circuit 104. A semiconductor module 154 includes the surge voltage detection circuit 104, a low-side transistor 10, and a high-side transistor 20. When the voltage between a first cathode 111b and a first end 112a changes with surge voltage detection, even if a direct-current power supply 30 tries to fix the voltage between the first cathode 111b and the first end 112a at $V_{DD}$ via the inductance element 146, it is not possible to fix the voltage to $V_{DD}$ within a short period of time, because a counter electromotive force acts on the inductance element 146. Therefore, within a short period of time, it is possible to change the voltage between the first cathode 111b and the first end 112a, thus making surge voltage detection possible.

The semiconductor device and the power conversion device according to the present embodiment also make it possible to provide a semiconductor device and a power conversion device which are capable of detecting a surge voltage.

Fourth Embodiment

The semiconductor device according to the present embodiment is different from the first to third embodiments in that a bias element 140 serves as a switch 148. In this regard, descriptions of contents that overlap with the first to third embodiments will be omitted.

Figure 10:
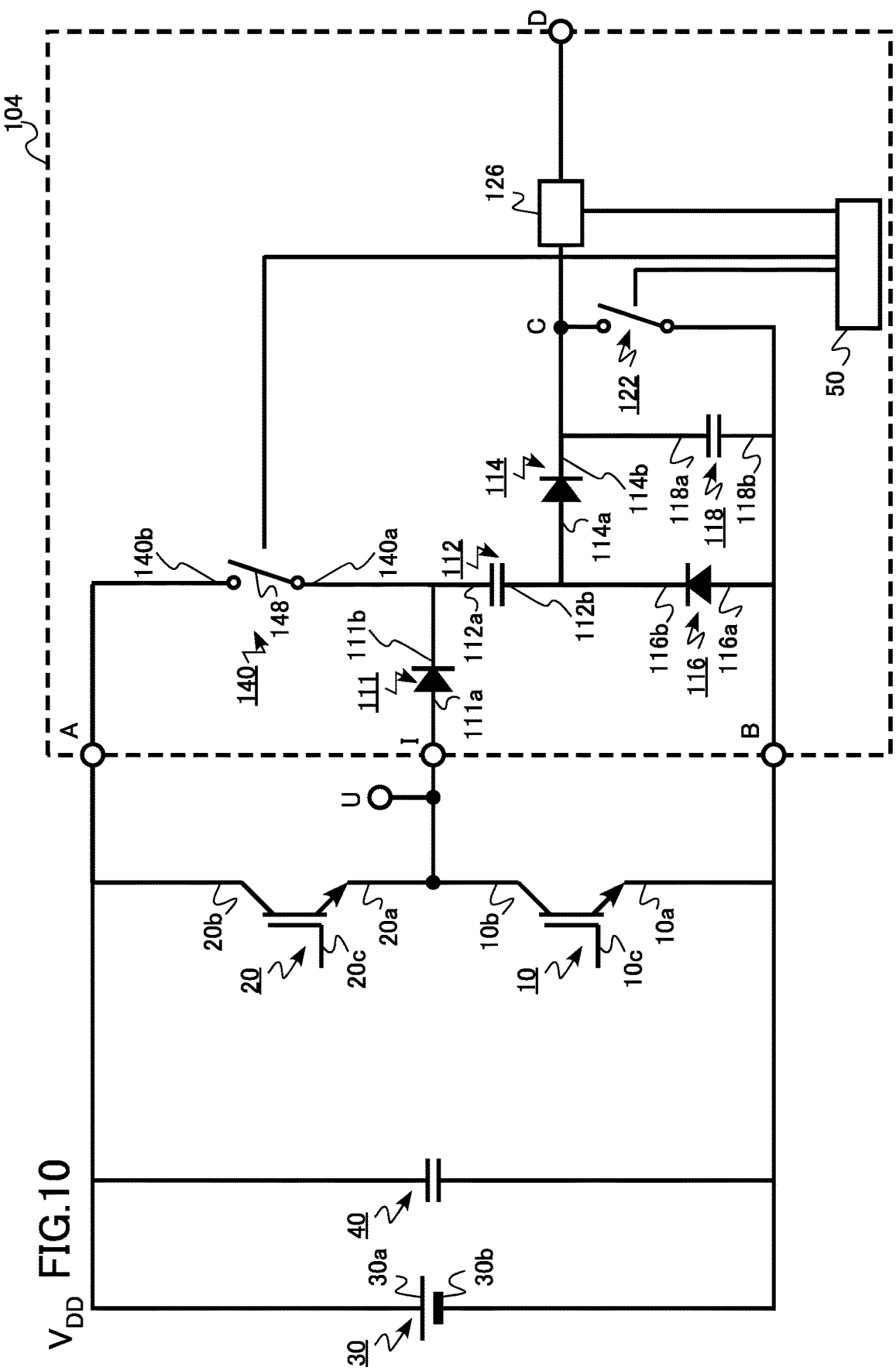
FIG. 10 is a schematic diagram of the semiconductor device according to a fourth embodiment.

FIG. 10 is a schematic diagram of the semiconductor device according to the present embodiment. The semiconductor device according to the present embodiment serves as a surge voltage detection circuit 105. A semiconductor module 155 includes the surge voltage detection circuit 105, a low-side transistor 10, and a high-side transistor 20. For surge voltage detection, for example, a controller 50 is used to turn off the switch 148. Thus, the voltage between a first cathode 111b and a first end 112a is not fixed at $V_{DD}$, thus making surge voltage detection possible.

The switch 148 is a transistor such as a metal-oxide-semiconductor-field-effect-transistor (MOSFET), for example.

The semiconductor device and the power conversion device according to the present embodiment also make it possible to provide a semiconductor device and a power conversion device which are capable of detecting a surge voltage.

Fifth Embodiment

The semiconductor device according to the present embodiment is different from the first to fourth embodiments in that the semiconductor device includes a variable resistor electrically connected to a gate electrode, and a controller that controls the resistance value of the variable resistor on the basis of the voltage value output from an analog-digital converter or a sample-and-hold circuit. Hereinafter, descriptions of contents that overlap with the first to fourth embodiments will be omitted.

Figure 11:
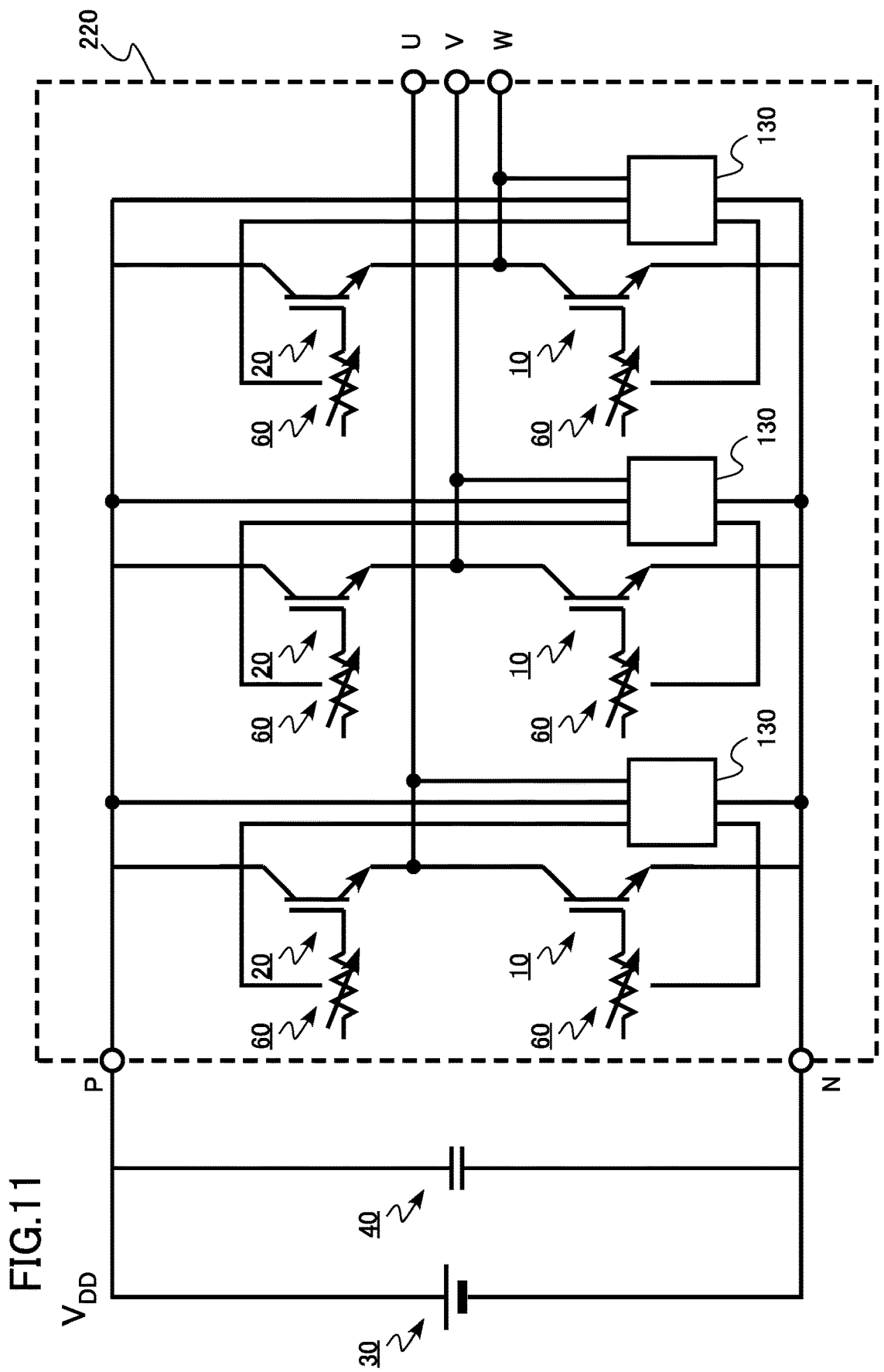
FIG. 11 is a schematic diagram of a power conversion device according to a fifth embodiment.

FIG. 11 is a schematic diagram of a power conversion device according to the present embodiment. The power conversion device according to the present embodiment serves as an inverter circuit 220 including a surge voltage detection circuit 130.

The inverter circuit 220 according to the present embodiment achieves so-called active gate control which dynamically controls the gate voltage of a power transistor.

The inverter circuit 220 includes a variable resistor 60. The variable resistor 60 is electrically connected to each of a gate electrode 10c of a low-side transistor (transistor) 10 and a gate electrode 20c of a high-side transistor (transistor) 20.

Figure 12:
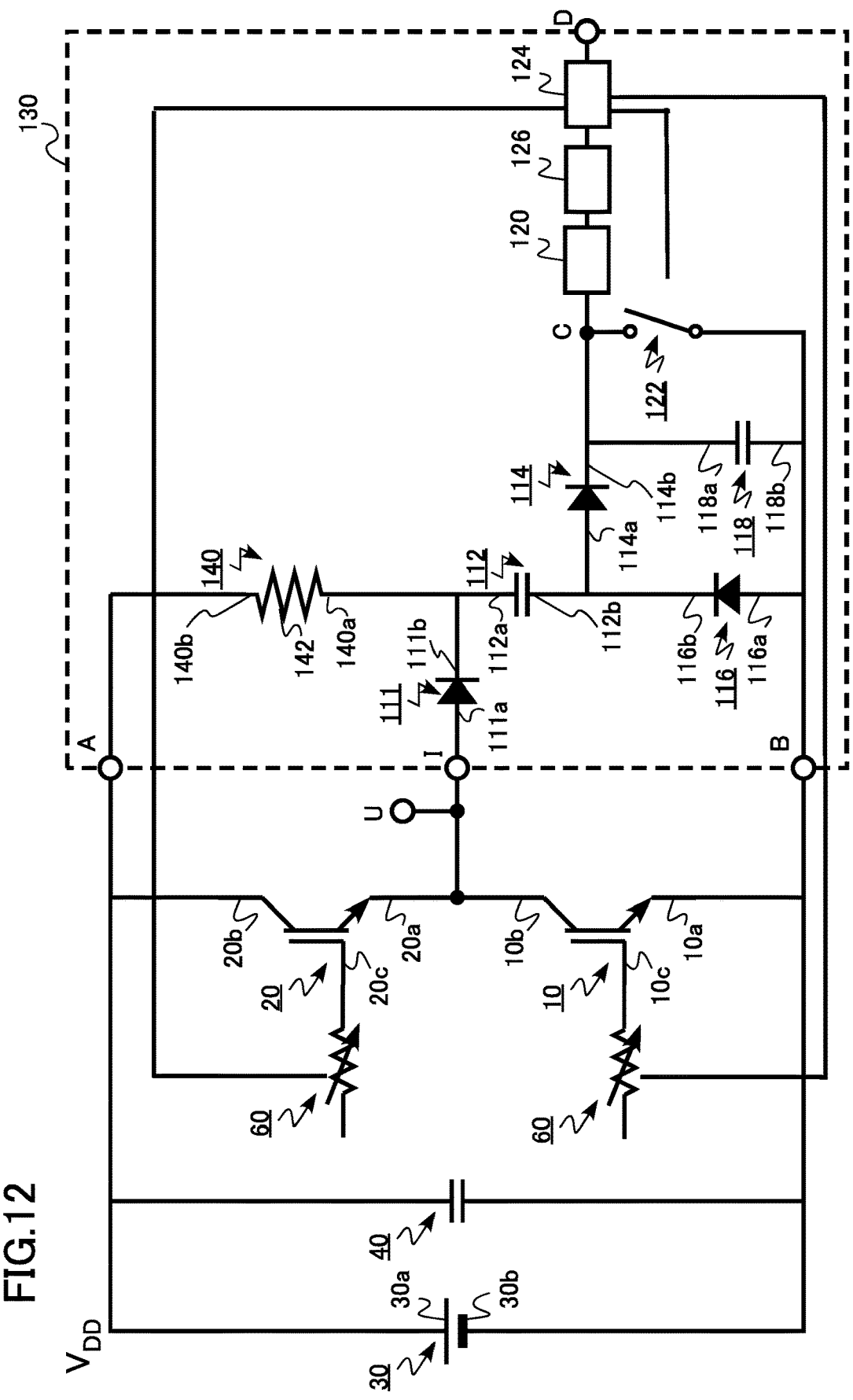
FIG. 12 is a schematic diagram of a semiconductor device according to the fifth embodiment.

FIG. 12 is a schematic diagram of the semiconductor device according to the present embodiment. The semiconductor device according to the present embodiment serves as the surge voltage detection circuit 130. A semiconductor module 160 includes the surge voltage detection circuit 130, the low-side transistor 10, and the high-side transistor 20.

The surge voltage detection circuit 130 includes a sample-and-hold circuit 120, an analog-digital converter 126, and a microcomputer (controller) 124. It is to be noted that the microcomputer 124 is an example of a second controller. In addition, different commercially available microcomputers or the like may be used for the controller 50 described in the first embodiment and the microcomputer 124. In addition, one commercially available microcomputer or the like may have both functions as the controller 50 and the microcomputer 124.

The voltage value at a point C is input to the microcomputer 124 via the sample-and-hold circuit 120 and the analog-digital converter 126.

The analog-digital converter 126 is connected to the sample-and-hold circuit 120. The analog-digital converter 126 digitally converts the voltage detected by the sample-and-hold circuit 120, and outputs the converted voltage. The analog-digital converter 126 connected to the sample-and-hold circuit 120 is provided, thereby allowing for the digital output of the surge voltage. It is to be noted that there is no need to provide the sample-and-hold circuit 120.

The voltage value at the point C is based on the peak value of the surge voltage. The microcomputer 124 issues a command to change the resistance value of the variable resistor 60, on the basis of the peak value of the surge voltage derived from the voltage value at the point C. As a result, the gate charging/discharging currents of the low-side transistor 10 and the high-side transistor 20 are changed, thereby controlling the inverter circuit 220 so that the surge voltage is equal to or less than a predetermined voltage value.

The configuration of the variable resistor 60 is not to be considered limited as long as the resistor is variable. For example, the variable resistor 60 is a MOSFET that performs analog operation. In accordance with the command from the microcomputer 124, for example, the gate voltage of the MOSFET is changed to change the resistance. Alternatively, for example, the variable resistor 60 has a plurality of MOSFETs connected in parallel. The resistance is changed by switching the numbers of MOSFETs in the ON state and the OFF state.

The on/off operation of the switch 122 is also controlled by a command from the microcomputer 124.

As described above, according to the present embodiment, the gate voltage of the power transistor is dynamically controlled with the use of the surge voltage detection circuit, thereby making it possible to achieve an inverter circuit which suppresses the surge voltage.

Sixth Embodiment

The driving device according to the present embodiment is a driving device including the power conversion device according to the first embodiment.

Figure 13:
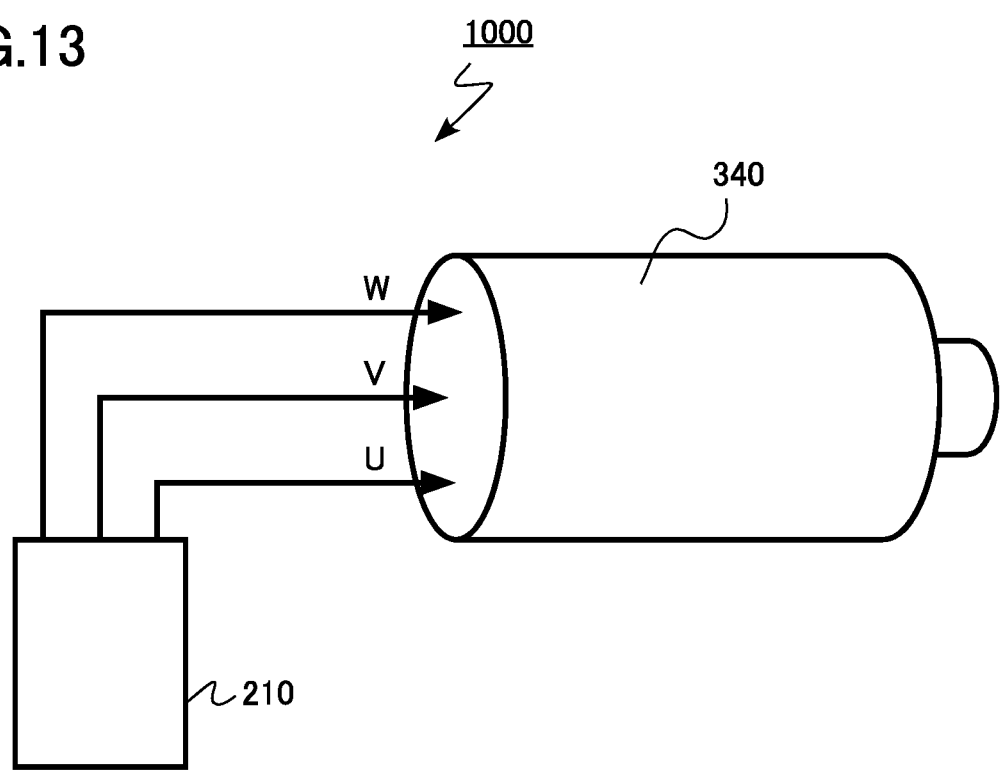
FIG. 13 is a schematic diagram of a driving device according to a sixth embodiment.

FIG. 13 is a schematic diagram of the driving device according to the present embodiment. The driving device 1000 includes a motor 340 and an inverter circuit 210. The motor 340 is driven by alternating-current voltage output from the inverter circuit 210.

According to the present embodiment, the inverter circuit 210 capable of surge voltage detection is provided, thereby improving the characteristics of the driving device 1000.

Seventh Embodiment

The vehicle according to the present embodiment is a vehicle including the power conversion device according to the first embodiment.

Figure 14:
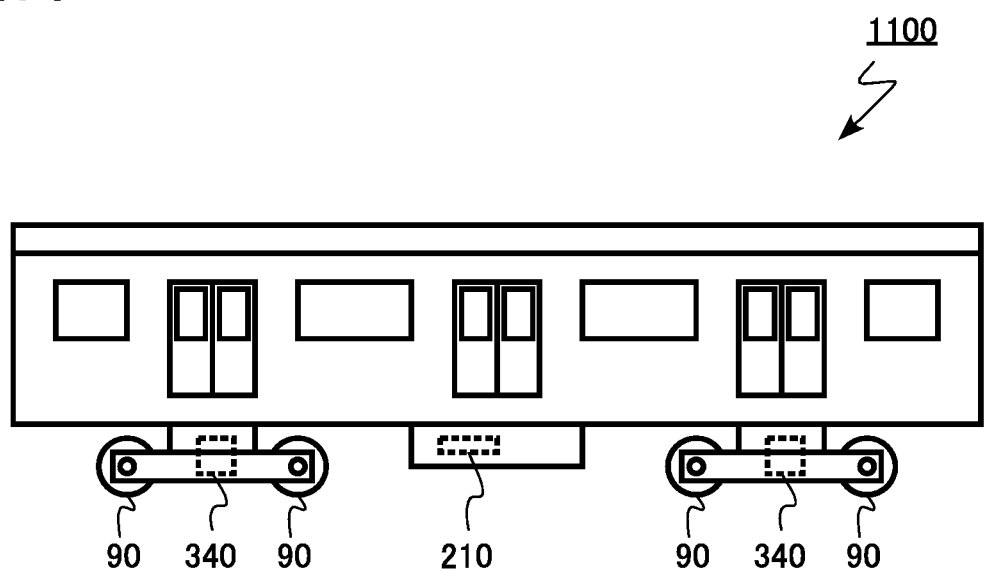
FIG. 14 is a schematic diagram of a vehicle according to a seventh embodiment.

FIG. 14 is a schematic diagram of a vehicle according to the present embodiment. The vehicle 1100 according to the present embodiment is a rail vehicle. The vehicle 1100 includes a motor 340 and an inverter circuit 210.

The motor 340 is driven by alternating-current voltage output from the inverter circuit 210. The motor 340 rotates wheels 90 of the vehicle 1100.

According to the present embodiment, the inverter circuit 210 capable of surge voltage detection is provided, thereby improving the characteristics of the vehicle 1100.

Eighth Embodiment

The vehicle according to the present embodiment is a vehicle including the power conversion device according to the first embodiment.

Figure 15:
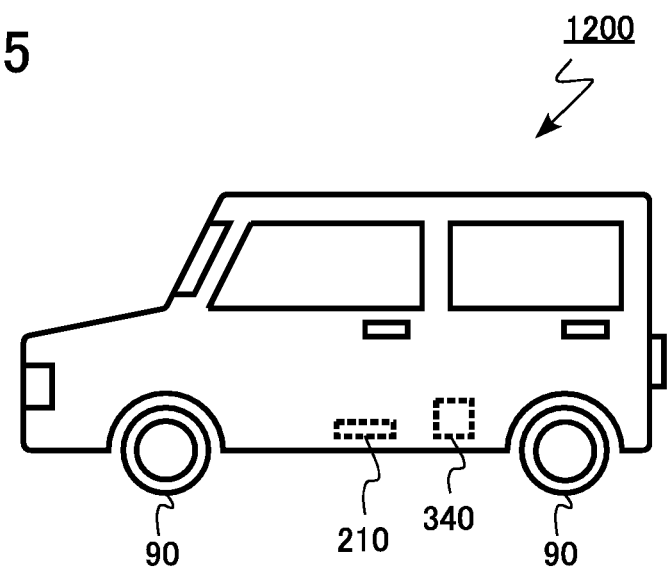
FIG. 15 is a schematic diagram of a vehicle according to an eighth embodiment.

FIG. 15 is a schematic diagram of a vehicle according to the present embodiment. The vehicle 1200 according to the present embodiment is a car. The vehicle 1200 includes a motor 340 and an inverter circuit 210.

The motor 340 is driven by alternating-current voltage output from the inverter circuit 210. The motor 340 rotates wheels 90 of the vehicle 1200.

According to the present embodiment, the inverter circuit 210 capable of surge voltage detection is provided, thereby improving the characteristics of the vehicle 1200.

Ninth Embodiment

The elevator according to the present embodiment is an elevator including the power conversion device according to the first embodiment.

Figure 16:
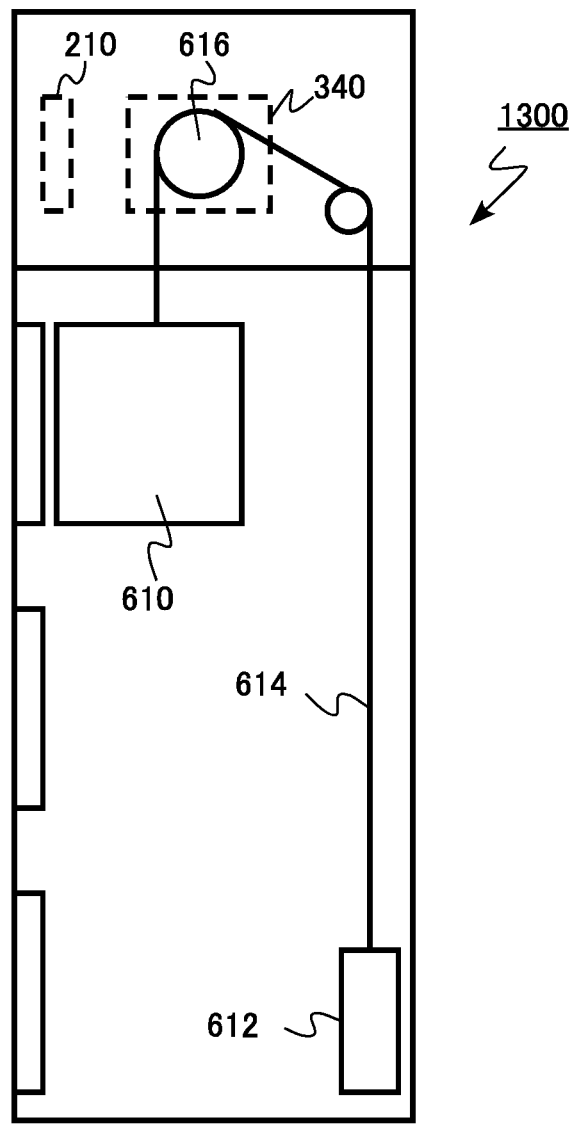
FIG. 16 is a schematic diagram of an elevator according to a ninth embodiment.

FIG. 16 is a schematic diagram of an elevator (elevator) according to the present embodiment. The elevator 1300 according to the present embodiment includes a cage 610, a counterweight 612, a wire rope 614, a hoisting machine 616, a motor 340, and an inverter circuit 210.

The motor 340 is driven by alternating-current voltage output from the inverter circuit 210. The motor 340 rotates the hoisting machine 616, thereby moving up and down the cage 610.

According to the present embodiment, the inverter circuit 210 capable of surge voltage detection is provided, thereby improving the characteristics of the elevator 1300.

In this specification, the inverter circuit has been described as an example of the power conversion device, but it is also possible to apply a DC-DC converter as the power conversion device. In addition, a case where the surge voltage detection circuit detects the surge voltage generated in the transistor of the power conversion device has been described as an example, but it is also possible to apply the surge voltage detection circuits according to the embodiment and the modified example for the detection of the surge voltage generated in a transistor used for any other device than the power conversion device.

In addition, in the present specification, a case of applying the semiconductor device and the power conversion device according to the present embodiment to a driving device, a vehicle, or an elevator has been described as an example, but it is also possible to apply the semiconductor device and the power conversion device according to the present disclosure, for example, to power conditioners of photovoltaic power generation systems and the like. Furthermore, it is possible to connect and apply the semiconductor device and the power conversion device also to a device that produces a voltage waveform associated with an overvoltage or an overshoot, for example, a terminal of a motor.

While certain embodiments have been described, these embodiments have been presented by way of example only, and are not intended to limit the scope of the inventions. Indeed, the semiconductor device, the power conversion device, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first diode having a first anode and a first cathode, the first anode for electrically connecting to one of a first electrode and a second electrode of a semiconductor element comprising the first electrode, the second electrode, and a gate electrode;
    a first capacitor having a first end electrically connected to the first cathode, and a first other end;
    a bias element having a first bias element end electrically connected to the first cathode and the first end, and a second bias element end for electrically connecting to a positive electrode of a direct-current power supply comprising the positive electrode and a negative electrode;
    a second diode having a second anode and a second cathode, the second anode electrically connected to the first other end;
    a second capacitor having a second end and a second other end, the second end electrically connected to the second cathode;
    a switch electrically connected in parallel to the second capacitor between the second end and the second other end;
    an analog-digital converter or sample-and-hold circuit electrically connected to the second cathode and the second end; and
    a third diode having a third anode and a third cathode, the third anode electrically connected to the second other end, and the third cathode electrically connected to the first other end and the second anode.

2. The semiconductor device according to claim 1, wherein the semiconductor element is a transistor.

3. The semiconductor device according to claim 1, wherein the semiconductor element contains SiC, a nitride semiconductor material, or Si.

4. The semiconductor device according to claim 2, wherein the semiconductor element comprises an IGBT.

5. The semiconductor device according to claim 1, wherein the second diode comprises a Schottky barrier diode.

6. The semiconductor device according to claim 1, wherein the third diode is a Schottky barrier diode.

7. The semiconductor device according to claim 1, wherein the first capacitor and the second capacitor are film capacitors or ceramic capacitors.

8. The semiconductor device according to claim 1, wherein the sample-and-hold circuit is electrically connected to the second cathode and the second end, and a power supply voltage $V_{DD}$ of the semiconductor element, a capacitance $C_1$ of the first capacitor, and a capacitance $C_2$ of the second capacitor satisfy a relationship of $15\ V \geq (C_1 V_{DD})/(C_1+C_2)$.

9. The semiconductor device according to claim 1, wherein a capacitance $C_1$ of the first capacitor is $\frac{1}{10}$ or less of an output capacitance of the semiconductor element.

10. The semiconductor device according to claim 1, wherein a capacitance $C_2$ of the second capacitor is 100 pF or more.

11. The semiconductor device according to claim 1, wherein the bias element is a resistance element.

12. The semiconductor device according to claim 11, wherein the bias element further comprises a fourth diode connected in parallel to the resistance element, the fourth diode has a fourth anode and a fourth cathode, and the fourth cathode is electrically connected to the first cathode and the first end.

13. The semiconductor device according to claim 1, wherein the bias element is an inductance element.

14. The semiconductor device according to claim 1, wherein the bias element is a switch.

15. The semiconductor device according to claim 1, further comprising a first controller for controlling on/off of the switch.

16. The semiconductor device according to claim 1, further comprising:
    a variable resistor electrically connected to the gate electrode; and a second controller for controlling a resistance value of the variable resistor, based on a voltage value output from the analog-digital converter or the sample-and-hold circuit.

17. A power conversion device comprising the semiconductor device according to claim 1.

18. A driving device comprising the power conversion device according to claim 17.

19. A vehicle comprising the power conversion device according to claim 17.

20. An elevator comprising the power conversion device according to claim 17.

* * * * *